US012674079B2

(12) United States Patent
Youn

(10) Patent No.: US 12,674,079 B2
(45) Date of Patent: Jul. 7, 2026

(54) ADHESIVE MATERIAL AND DISPLAY APPARATUS

(71) Applicant: LG Display Co., Ltd., Seoul (KR)

(72) Inventor: Yeo-O Youn, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 735 days.

(21) Appl. No.: 18/088,130

(22) Filed: Dec. 23, 2022

(65) Prior Publication Data

US 2023/0203346 A1 Jun. 29, 2023

(30) Foreign Application Priority Data

Dec. 27, 2021 (KR) ........................ 10-2021-0188229

(51) Int. Cl.

| | |
|---|---|
| *C08F 2/46* | (2006.01) |
| *C08F 2/50* | (2006.01) |
| *C08G 61/04* | (2006.01) |
| *C09J 7/10* | (2018.01) |
| *C09J 7/30* | (2018.01) |
| *C09J 11/04* | (2006.01) |
| *H10K 59/65* | (2023.01) |
| *H10K 59/80* | (2023.01) |
| *H10K 71/00* | (2023.01) |
| *H10K 71/80* | (2023.01) |
| *H10K 77/10* | (2023.01) |
| *H10K 59/12* | (2023.01) |
| *H10K 102/00* | (2023.01) |

(52) U.S. Cl.
CPC . *C09J 7/30* (2018.01); *C09J 7/10* (2018.01); *C09J 11/04* (2013.01); *H10K 59/65* (2023.02); *H10K 59/8793* (2023.02); *H10K 71/00* (2023.02); *H10K 71/80* (2023.02); *H10K 77/111* (2023.02); *C09J 2203/326* (2013.01); *C09J 2301/416* (2020.08); *C09J 2400/146* (2013.01); *C09J 2400/228* (2013.01); *H10K 59/1201* (2023.02); *H10K 2102/311* (2023.02)

(58) Field of Classification Search
CPC ..... B32B 27/365; B32B 27/281; B32B 27/08; B32B 27/36; B32B 27/306; B32B 27/302; B32B 27/286; B32B 23/08; B32B 15/18; B32B 15/20; B32B 5/18; B32B 9/045; B32B 3/266; B32B 17/10; B32B 2457/20; B32B 2255/26; B32B 2255/06; B32B 2255/10; B32B 2255/062; B32B 2307/412; B32B 2307/42; B32B 2307/546; B32B 2307/7376; B32B 2266/045; C09J 7/10; C09J 7/30; C09J 11/04; C09J 2203/318; C09J 2203/326; C09J 2400/228; C09J 2400/146; C09J 2301/416; C09J 2301/408; H10K 71/80; H10K 71/00; H10K 59/8793; H10K 59/65; H10K 59/8791; H10K 59/873; H10K 59/1201; H10K 77/111; H10K 2102/311; H10K 2102/331; C08K 3/36; C08K 2201/011
USPC ................. 522/93, 71, 1, 6, 189, 184; 520/1
See application file for complete search history.

(56) References Cited

U.S. PATENT DOCUMENTS

| | | | | |
|---|---|---|---|---|
| 10,739,636 B2 * | 8/2020 | Lee | ........................ | B32B 27/30 |
| 2014/0160406 A1 * | 6/2014 | Huh | ..................... | G02B 5/3033 |
| | | | | 359/483.01 |
| 2016/0130482 A1 | 5/2016 | Fornof et al. | | |
| 2019/0137675 A1 | 5/2019 | Kanno et al. | | |
| 2020/0181456 A1 | 6/2020 | Gasa et al. | | |
| 2020/0186688 A1 * | 6/2020 | Chen | ..................... | H04N 23/54 |
| 2020/0358027 A1 | 11/2020 | Shin et al. | | |

FOREIGN PATENT DOCUMENTS

| | | |
|---|---|---|
| CN | 105916899 A | 8/2016 |
| CN | 110323253 A | 10/2019 |
| CN | 111913315 A | 11/2020 |
| CN | 113078186 A | 7/2021 |
| DE | 198 36 695 A1 | 2/2000 |
| JP | 2012/62471 A | 3/2012 |
| JP | WO2017/199979 A1 | 11/2017 |
| JP | 2020-134911 A | 8/2020 |
| KR | 10-2015-0000126 A | 1/2015 |
| KR | 10-2016-0077221 A | 7/2016 |
| KR | 10-2019-0006477 A | 1/2019 |
| KR | 10-2020-0129225 A | 11/2020 |
| KR | 10-2021-0085209 A | 7/2021 |
| KR | 10-2021-0088044 A | 7/2021 |

* cited by examiner

*Primary Examiner* — Jessica Whiteley
(74) *Attorney, Agent, or Firm* — Birch, Stewart, Kolasch & Birch, LLP

(57) ABSTRACT

A display apparatus can include a plate, a display panel on the plate to display an image, a polarizing plate on the display panel, a first film on the polarizing plate, a front member on the first film, and wherein at least one adhesive layer, wherein the at least one adhesive layer includes a monomer, an oligomer, a photoinitiator and a nano-inorganic particle, and wherein an amount of the monomer is 70 wt % or more, and an amount of the oligomer is 20 wt % or less in the at least one adhesive layer.

15 Claims, 11 Drawing Sheets

FIG. 6

DIS

ADHESIVE MATERIAL AND DISPLAY APPARATUS

CROSS-REFERENCE TO RELATED APPLICATIONS

The present application claims the priority benefit under 35 U.S.C. § 119(a) to Korean Patent Application No. 10-2021-0188229, filed in Republic of Korea on Dec. 27, 2021, the entire contents of which are hereby expressly incorporated by reference into the present application.

BACKGROUND OF THE INVENTION

Technical Field

The present disclosure relates to an apparatus, and more particularly to, for example, a display apparatus in which a hole can be easily processed and a defect does not occur in folding the display apparatus.

Description of the Related Art

Recently, with a development of multimedia devices, an importance of a flat display apparatus has been increasing. In response to this development, flat display apparatuses such as a liquid crystal display apparatus and an organic electroluminescent display apparatus have been commercialized. Among these flat display apparatuses, the organic electroluminescent display apparatus is currently widely used and offers advantages such as high response speed, high luminance and wide viewing angle.

In addition, the display apparatus is provided with an optical component such as a camera in order to provide various functions to a user. In order to mount the optical component such as a camera, a display apparatus have been developed where a part of the display apparatus in which the optical component is disposed is cut or a hole is formed in the display apparatus.

SUMMARY OF THE DISCLOSURE

However, as recognized by the inventor of present disclosure, the display apparatus is configured with a display panel, a polarizing plate, and many films, which are attached to each other by an adhesive. When the display panel, polarizing plate, and many films are cut and the separated part is peeled off in order to form a hole inside the display apparatus, limitations such as poor peeling due to the adhesive or residual adhesive inside the cut hole after processing can occur.

Accordingly, the present disclosure is directed to a display apparatus that substantially obviates or addresses one or more of the limitations and disadvantages associated with the related art.

An advantage of the present disclosure is to provide a display apparatus which reduces a viscosity of an adhesive material and can facilitate peeling of a processed part and the like and to prevent or reduce an adhesive material from remaining when processing a hole and the like, and can prevent or reduce a folding defect due to an increase in modulus.

Additional features and aspects of the disclosure will be set forth in the description which follows, and in part will be apparent from the description, or can be learned by practice of the inventive concepts provided herein. These and other advantages of the disclosure will be realized and attained by the structures particularly pointed out in the present disclosure and claims hereof as well as the appended drawings.

To achieve these and other aspects and in accordance with the purpose of the present disclosure, as embodied and broadly described herein, a display apparatus can include: a plurality of members laminated on each other with an adhesive layer disposed respectively therebetween; and wherein at least one of the adhesive layers includes a monomer, an oligomer, a photoinitiator and a nano-inorganic particle.

To achieve these and other aspects and in accordance with the purpose of the present disclosure, as embodied and broadly described herein, an adhesive material, can include: 70 wt % or more of a monomer; 20 wt % or less of an oligomer; a photoinitiator; and/or a nano-inorganic particle.

To achieve these and other aspects and in accordance with the purpose the present disclosure, as embodied and broadly described herein a display apparatus can include a plurality of layers; and at least one adhesive layer disposed between an adjacent two of the plurality of layers, wherein the at least one adhesive layer includes a monomer, an oligomer, a photoinitiator and a nano-inorganic particle, and wherein an amount in wt % of the monomer is greater than an amount in wt % of the oligomer in the at least one adhesive layer.

It is to be understood that both the foregoing general description and the following detailed description are by example and explanatory and are intended to provide further explanation of the inventive concepts as claimed.

BRIEF DESCRIPTION OF THE DRAWINGS

The accompanying drawings, which can be included to provide a further understanding of the disclosure and can be incorporated in and constitute a part of this the disclosure, illustrate embodiments of the disclosure and together with the description serve to explain various principles of the disclosure. In the drawings:

FIG. 6 is a cross-sectional view illustrating a relationship between a molecular weight and a viscosity according to an embodiment of the present disclosure;

Figure 1A:
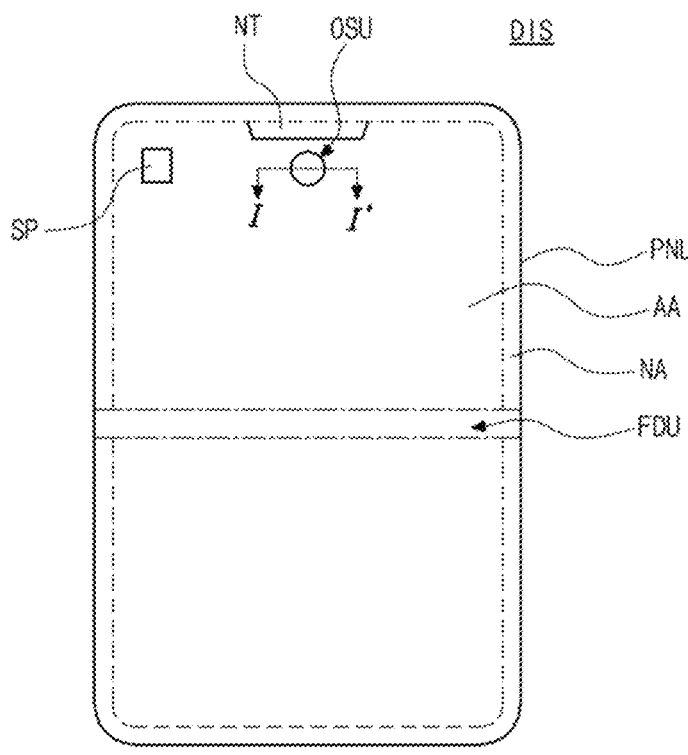
FIG. 1A is a plan view illustrating a display apparatus according to an embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience.

DETAILED DESCRIPTION OF THE EMBODIMENTS

Advantages and features of the present disclosure and methods of achieving them will be apparent with reference to the embodiments described below in detail with the accompanying drawings. However, the present disclosure is not limited to the embodiments disclosed below, but can be realized in a variety of different forms, and these embodiments are only examples for allowing the present disclosure to be complete. The present disclosure is provided to fully inform the scope of the disclosure to the skilled in the art of the present disclosure.

The shapes, sizes, areas, proportions, angles, numbers, and the like disclosed in the drawings for explaining the embodiments of the present disclosure can be illustrative, and the present disclosure is not limited to the illustrated matters. The same reference numerals refer to the same components throughout the description.

Furthermore, in describing the present disclosure, if it is determined that a detailed description of the related known technology unnecessarily obscure the subject matter of the present disclosure, the detailed description thereof can be omitted or can be briefly provided. When 'comprising', 'including', 'having', 'consisting', and the like are used in this disclosure, other parts can be added unless a more limiting term, such as 'only,' is used. When a component is expressed in the singular, cases including the plural are included unless specific statement is described to the contrary.

In interpreting the components, even if there is no separate explicit description, it is interpreted as including an error or a margin range.

In the case of a description of a positional relationship, for example, when the positional relationship of two parts is described as 'on', 'over', 'above', 'below', 'beside', 'under', 'next' or the like, one or more other parts can be positioned between such two parts unless a more limiting term, such as 'immediate(ly)', 'right', 'close(ly)', or 'directly', is used.

In the case of a description of a temporal relationship, for example, when a temporal precedence is described as, for example, 'after', 'subsequent', 'following', 'before', and the like, cases that are not continuous can be included unless a more limiting term, such as 'just', 'directly' or 'immediately' is used.

Respective features of various embodiments of the present disclosure can be partially or wholly connected to or combined with each other and can be technically inter-operated and driven variously, and respective embodiments can be independently implemented from each other or can be implemented together with a related relationship.

In describing components of the present disclosure, terms such as first, second, A, B, (a), (b) and the like can be used. These terms can be only for distinguishing one component from other components, and an essence, sequence, order, or number of the components should not be limited by these terms. Further, when it is described that a component is "connected", "coupled" or "contact" to another component, the component can be directly connected or contact another component, but it should be understood that other component can be "interposed" between the components, unless otherwise specified.

"At least one" should be understood to include all combinations of one or more of associated components. For example, meaning of "at least one of first, second, and third components" encompasses not only each individual component (the first, second, or third component), but also all combinations of any two or more of the first, second and third components.

In this disclosure, an "apparatus" can include a display apparatus, such as a liquid crystal module (LCM), an organic light emitting display module (OLED module) or the like, including a display panel and a driving portion for driving the display panel. Furthermore, the "apparatus" can include a complete product or final product which is a notebook computer, a television, a computer monitor, an automotive device or equipment display including other type of vehicle, or a set electronic device or set device or set apparatus such as a mobile electronic device which is a smart phone, an electronic pad or the like, including the LCM, OLED module or the like.

Therefore, the apparatus of this disclosure can include a display apparatus itself such as the LCM, OLED or the like, and/or an application product or a set device that is an end-user device, including the LCM, OLED module or the like.

Further, in some embodiments, the LCM, OLED module or the like configured with a display panel and a driving portion can be expressed as a "display apparatus", and an electronic apparatus as a final product including the LCM, OLED module or the like can be distinguished and expressed as a "set device." For example, the display apparatus can include a liquid crystal or organic light emitting diode (OLED) display panel, and a source PCB that is a control portion for driving the display panel. The set device can further include a set PCB which is a set control portion electrically connected to the source PCB to drive the entire set device.

The display panel used in embodiments of the present disclosure can use all types of display panels such as a liquid crystal display panel, an organic light emitting diode (OLED) display panel, and an electro-luminescent display panel, but the embodiments are not limited thereto. For example, the display panel can be a display panel capable of generating sound by being vibrated by a vibrating device according to embodiments of the present disclosure. The display panel applied to the display apparatus according to embodiments of the present disclosure is not limited to a shape or size of the display panel.

Hereinafter, example embodiments of the present disclosure are described with reference to accompanying drawings. Scales of components shown in the drawings can be different from scales of actual components for convenience of description, and thus the illustrated components are not limited to sizes shown in the drawings. Further, all the components of each display apparatus according to all embodiments of the present disclosure are operatively coupled and configured.

Figure 1B:
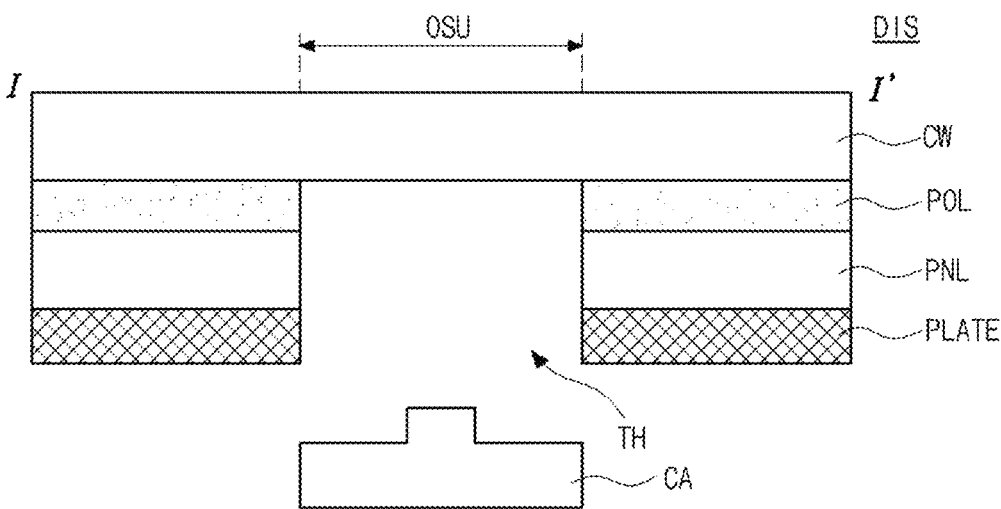
FIG. 1B is a cross-sectional view taken along a line I-I' of FIG. 1A according to an embodiment of the present disclosure.

FIG. 1A is a plan view illustrating a display apparatus according to the present disclosure, and FIG. 1B is a cross-sectional view taken along a line I-I' of FIG. 1A according to the present disclosure.

As shown in FIGS. 1A and 1B, a display apparatus DIS according to the present disclosure can include a plate PLATE (see FIG. 1B), a display panel PNL disposed on the plate PLATE, a polarizing plate POL disposed on the display panel PNL, and a front member CW disposed on the polarizing plate POL. Other components or elements can be further included in the display apparatus DIS. All components of each display apparatus according to all embodiments of the present disclosure are operatively coupled and configured.

The display panel PNL can display an actual image, and the display panel PNL can use an organic light emitting diode display panel, a liquid crystal display panel, an electrophoretic display panel, a mini LED (light emitting diode) display panel, or a micro LED display panel. Other types of a display panels, such as electronic paper or electroluminescent display can also be used. Hereinafter, an organic light emitting diode display panel is explained by way of example.

The display apparatus DIS can include a display area AA, a non-display area NA, an optical component area OSU, and a folding area FDU. The display area AA can include a plurality of sub-pixels SP. The sub-pixels SP can include a red sub-pixel, a green sub-pixel and a blue sub-pixel, and if necessary, can further include a white sub-pixel, and a light emitting element is provided in each sub-pixel SP to output light of a corresponding color to display an image.

The non-display area NA is an area in which an image is not displayed, and can be formed along a periphery of the display area AA. Various lines and electronic components for driving the plurality of sub-pixels SP disposed in the display area AA can be disposed in the non-display area NA. For example, various ICs such as a gate driving IC and/or a data driving IC and pad areas can be mounted in the non-display area NA, and/or a gate driving portion can be directly formed in a form of a GIP (Gate In Panel), but embodiments of the present disclosure are not limited thereto. In addition to the periphery of the display area AA, the non-display area NA can be formed at other areas, such as near the notch NT or encircling the optical component area OSU, for example.

The optical component area OSU can be formed in the display area AA or a part of the display area AA (e.g., a part of optical component area OSU is formed in the display area AA and another part of optical component area OSU is formed in the non-display area NA). The optical component area OSU can be an area in which an optical component such as a camera CA and/or an optical sensor is disposed. The optical sensor can include at least one of a proximity sensor, an infrared (IR) sensor, an ultraviolet (UV) sensor, and a fingerprint recognition sensor, but is not limited thereto. The optical component area OSU can include a hole TH passing through a part of the display apparatus to place the optical component therein, and the optical component such as the camera CA can be inserted or accommodated and fixed in the hole TH. The hole TH can be a through hole, and is not limited thereto. In other embodiments, the optical component area OSU need not be formed in the display area AA, but can be entirely formed in the non-display area AA. Additionally, the location of the optical component area OSU need not be at an upper middle of the display area AA, but can be other locations in the display area AA, such as near a corner of the display area AA, in a middle of the display area AA, or near or at the folding area FDU.

The folding area FDU can be an area in which the display apparatus DIS is folded or bent. The folding at the folding area FDU can be an in-folding to be folded to a side on which a screen is displayed, or can be an out-folding to be folded to the other side on which the screen is not displayed. A plurality of openings for reducing stress during folding can be formed in the folding area FDU. The folding area FDU need not be located in a middle of the display apparatus DIS, but can be in other locations such as the within the upper half, the lower half, or even near edges of the display apparatus. Additionally, a folding axis can be located horizontally, vertically, or even diagonally in the display apparatus DIS.

The front member CW can be disposed on the display panel PNL. The front member CW can protect the polarizing plate POL and the display panel PNL therebelow from external impact, moisture, heat and the like. The front member CW can be formed of a material having impact resistance and high light transmittance. For example, the front member CW can be formed of a glass, or a plastic film such as PI (Polyimide), PET (polyethylene terephthalate), PEN (polyethylene naphthalate), PC (polycarbonate), PES (polyethersulfone), PAR (polyarylate), PSF (polysulfone) or a cyclic-olefin copolymer (COC), and is not limited thereto. Other polymers, organic or inorganic materials can also be used. An example of a transparent inorganic material is transparent ceramics.

When the display apparatus DIS of the present disclosure can be applied to a foldable, stretchable, or rollable display apparatus, the front member CW can be formed of a thin glass with a thickness of several tens of micrometers that can be folded and rolled.

The polarizing plate POL can be disposed between the front member CW and the display panel PNL. Since the display panel PNL includes various metal patterns such as thin film transistors, lines and electrodes of light emitting elements, an external light incident into the display panel PNL is reflected by the metal patterns to reduce visibility of the display apparatus DIS. The polarizing plate POL can prevent reflection of light input from an outside, thereby improving visibility of the display apparatus DIS.

The plate PLATE can be disposed below the display panel PNL. In a foldable display apparatus DIS or a rollable display apparatus DIS, the substrate can be made of a plastic material or other flexible polymer such as polyimide or polyester. In this regard, a manufacturing process proceeds after the plastic substrate is disposed on a flat support substrate such as a glass substrate, and various components such as the thin film transistors and the light emitting elements are formed on the plastic substrate. After the display panel PNL is manufactured, the support substrate is separated from the display panel PNL. As such, when the support substrate is separated, a component for supporting the plastic substrate can be required, and the plate PLATE can be disposed on a rear surface of the substrate of the display panel PNL to support the substrate.

In addition, the plate PLATE can be made of a rigid material to protect the display panel PNL from external impact, and the plate PLATE can be a heat dissipating member that emits heat generated when the display apparatus DIS is driven. In addition, the plate PLATE can be made of a material having excellent electrical conductivity to discharge static electricity generated in the display apparatus DIS to the outside. The plate PLATE can be formed of at least one of copper (Cu), copper (Cu) foam, stainless steel, graphite, and polyethylene terephthalate (PET), an alloy material thereof, and/or a combination structure thereof, but is not limited thereto, and various metals or plastics can be used.

The hole TH formed in the optical component area OSU can be formed by processing and cutting the polarizing plate POL, the display panel PNL, and the plate PLATE, and the optical component such as the camera CA can be disposed inside the hole TH.

Instead of forming the optical component area OSU inside the display panel PNL, a notch NT can be formed in the display panel PNL. The notch NT can be formed by removing a part of one side of the display panel PNL, for example, one side of an upper portion of the display panel PNL and can have a plurality of optical components disposed therein. Alternatively, the notch NT can be formed by processing and cutting the polarizing plate POL, the display panel PNL and the plate PLATE.

The polarizing plate POL, the display panel PNL, and the plate PLATE can be bonded to each other by adhesives, and the hole TH can be formed by processing, cutting and removing the polarizing plate POL, the display panel PNL and the plate PLATE and the adhesives therebetween as well.

This processing can be usually done by laser. In this disclosure, when the polarizing plate POL, the display panel PNL, the plate PLATE, and the adhesives therebetween are processed and cut by laser, the cut region is easily separated from the display apparatus DIS and the adhesives in the processed region are completely removed, so that no adhesive residue is left inside the hole TH. Thus, defects caused by the adhesive residue can be prevented.

As recognized by the inventor, when processing the display apparatus DIS, a method for easily separating the cut region and preventing the adhesive residue from remaining inside the hole TH is to reduce an adhesive force of the adhesives. However, in this case, a modulus of the adhesives is increased, which causes a limitation in folding or bending of the display apparatus DIS.

In addition, the inventor further found that, in the case of smooth folding or bending of the display apparatus DIS by improving the adhesive force of the adhesives, a residue of the adhesives remains inside the hole TH when the hole TH is formed, and the cut parts of polarizing plate POL, the display panel PNL, and the plate PLATE are not separated.

In the present disclosure, there is provided a display apparatus DIS in which no or reduced adhesive residue remains in the hole TH when processing the display apparatus DIS and there is no problem in folding.

Hereinafter, embodiments according to the present disclosure are described in detail. Although this disclosure is applicable to various display apparatuses such as an organic light emitting diode display apparatus, a liquid crystal display apparatus, a mini LED display apparatus, and a micro LED display apparatus. However, the organic light emitting diode display apparatus is described as an example below. In addition, the display apparatus of the present disclosure can be applicable to various display apparatuses such as a foldable display apparatus, a rollable display apparatus, a flexible display apparatus, and a rigid display apparatus, but a foldable display apparatus is described as an example. Examples of additional types of display apparatuses can include electronic paper or a electroluminescent display.

Figure 2:
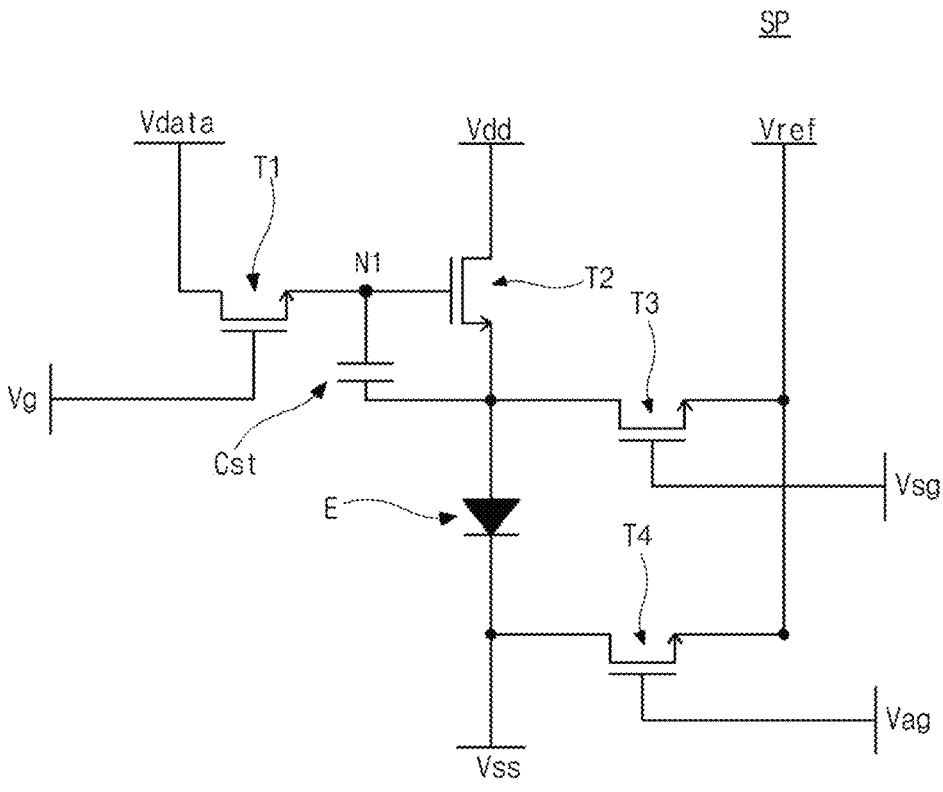
FIG. 2 is a circuit diagram of a display panel provided in a display apparatus according to an embodiment of the present disclosure.

FIG. 2 is an example of circuit diagram of an organic light emitting diode display panel provided in a display apparatus according to the present disclosure.

The organic light emitting diode display panel according to the present disclosure can include a display area and a pad area. The display area can include a plurality of sub-pixels SP. Each sub-pixel SP can display a single color in the organic light emitting diode display apparatus. For example, each sub-pixel SP can display any one of red, green, blue, and white. In this case, the red, green, blue, and white sub-pixels SP can be defined to form one pixel. The plurality of sub-pixels SP can be arranged in a matrix on the substrate of the organic light emitting diode display apparatus, and a plurality of lines can be disposed between the plurality of sub-pixels SP in the display area.

In addition, various lines electrically connected to the lines disposed in the display area and for applying signals to the light emitting element E of the organic light emitting diode display apparatus can be disposed in the pad area. The lines in the pad area can include, for example, a Vdd line, a Vdata line, a reference (Vref) line, auxiliary gate voltage Vag line and a Vss line, but are not limited thereto.

As shown in FIG. 2, each sub-pixel SP of the organic light emitting diode display panel can include a switching thin film transistor T1, a driving thin film transistor T2, a storage capacitor Cst, a sensing thin film transistor T3, an auxiliary thin film transistor T4, and the light emitting element E. Since the sub-pixel SP of the organic light emitting diode display apparatus according to the present disclosure includes four thin film transistors and one capacitor, it can be referred to as a 4T1C structure. However, the structure of the sub-pixel SP of the organic light emitting diode display apparatus according to the present disclosure is not limited thereto, and can be configured in various compensation structures such as a 4T2C structure including four thin film transistors and two capacitors, a 5T2C structure including five thin film transistors and two capacitors, a 6T2C structure including six thin film transistors and two capacitors, and a 7T2C structure including seven thin film transistors and two capacitors.

Each of the four thin film transistors included in the sub-pixel SP can include a semiconductor layer, a gate electrode, a source electrode, and a drain electrode, and can be a P-type thin film transistor or an N-type thin film transistor. FIG. 2 shows an N-type thin film transistor.

The switching thin film transistor T1 can include a drain electrode connected to a data line, a source electrode connected to a first node N1, and a gate electrode connected to a gate line. The switching thin film transistor T1 can be turned on based on a gate voltage Vg applied from a gate driving portion to the gate line, and can charge a data voltage Vdata, which is applied to the data line from a data driving portion, to the first node N1.

The driving thin film transistor T2 can include a drain electrode connected to a high potential line (e.g., a Vdd line), a source electrode connected to an anode of the light emitting element E, and a gate electrode connected to the first node N1. The driving thin film transistor T2 can be turned on when the voltage of the first node N1 is higher than a threshold voltage (Vth), and can be turned off when the voltage of the first node N1 is lower than the threshold voltage (Vth). The driving thin film transistor T2 can transfer a driving current received from the Vdd line to the light emitting element E when being turned on.

The storage capacitor Cst can include an electrode connected to the first node N1 and an electrode connected to the source electrode of the driving thin film transistor T2. The storage capacitor Cst can maintain a potential difference between the gate electrode and the source electrode of the driving thin film transistor T2 during an emission time in which the light emitting element E emits light, thereby providing a constant driving current to the light emitting element E.

The sensing thin film transistor T3 can include a drain electrode connected to the source electrode of the driving thin film transistor T2, a source electrode connected to the reference line, and a gate electrode connected to a sensing gate line and supplied with a sensing gate voltage Vsg. The sensing thin film transistor T3 can be a thin film transistor for sensing the threshold voltage of the driving thin film transistor T2.

The auxiliary thin film transistor T4 can include a drain electrode electrically connected to a cathode of the light emitting element E, a source electrode electrically connected to the reference line, and a gate electrode electrically connected to an auxiliary gate line and supplied with an auxiliary gate voltage Vag. The auxiliary thin film transistor T4 can be turned off in the emission time, and when the auxiliary thin film transistor T4 is turned on, it can transfer the reference voltage Vref to the cathode of the light emitting element E.

Figure 3:
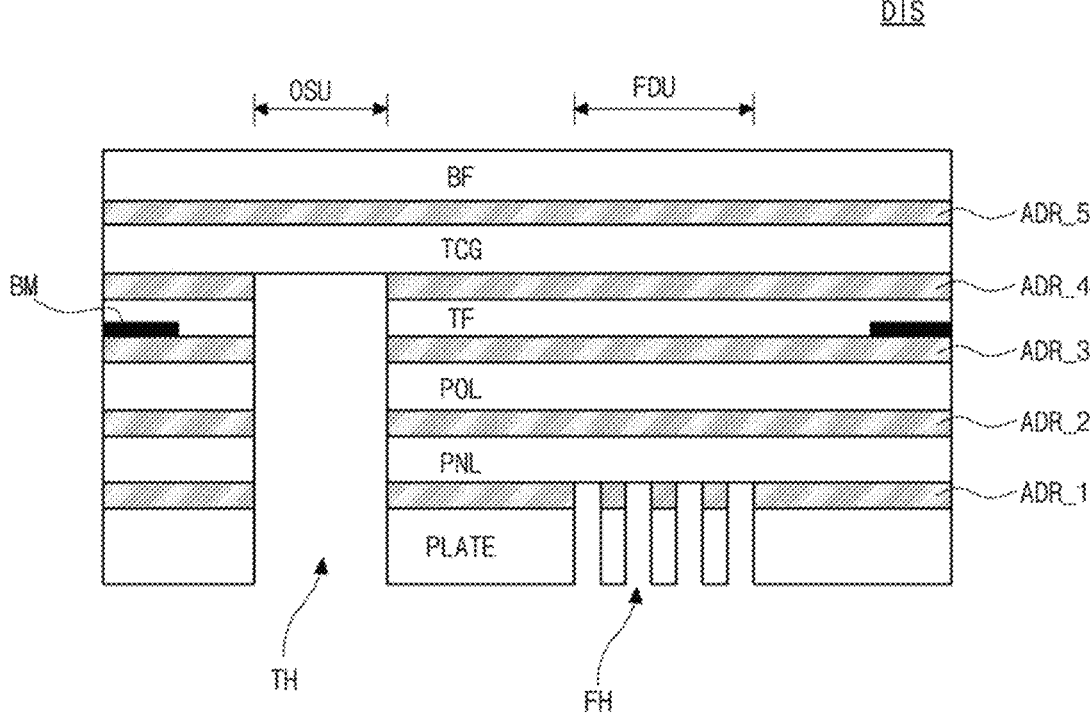
FIG. 3 is a cross-sectional view illustrating a display apparatus according to an embodiment of the present disclosure.

FIG. 3 is a view illustrating a display apparatus according to an embodiment of the present disclosure.

As shown in FIG. 3, the display apparatus DIS according to the embodiment of the present disclosure can include a plurality of layers, including one or more of a plate PLATE, a display panel PNL disposed on the plate PLATE to display an actual image, and a polarizing plate POL disposed on the display panel PNL to prevent reflection of external light incident from an outside, a transparent film TF disposed on the polarizing plate POL, and a front glass TCG disposed on the transparent film TF, and a protective member (or blocking film) BF disposed on the front glass TCG.

For example, the display panel PNL can be attached to the plate PLATE by a first adhesive layer ADR_1, the polarizing plate POL can be attached to the display panel PNL by a second adhesive layer ADR_2, and the transparent film TF can be attached to the polarizing plate POL by a third adhesive layer ADR_3. In addition, the front glass TCG can be attached to the transparent film TF by a fourth adhesive layer ADR_4, and the protective member BF can be attached to the front glass TCG by a fifth adhesive layer ADR_5. Accordingly, at least one adhesive layer can be disposed between adjacent two of the plurality of layers of the display apparatus DIS.

Figure 4:
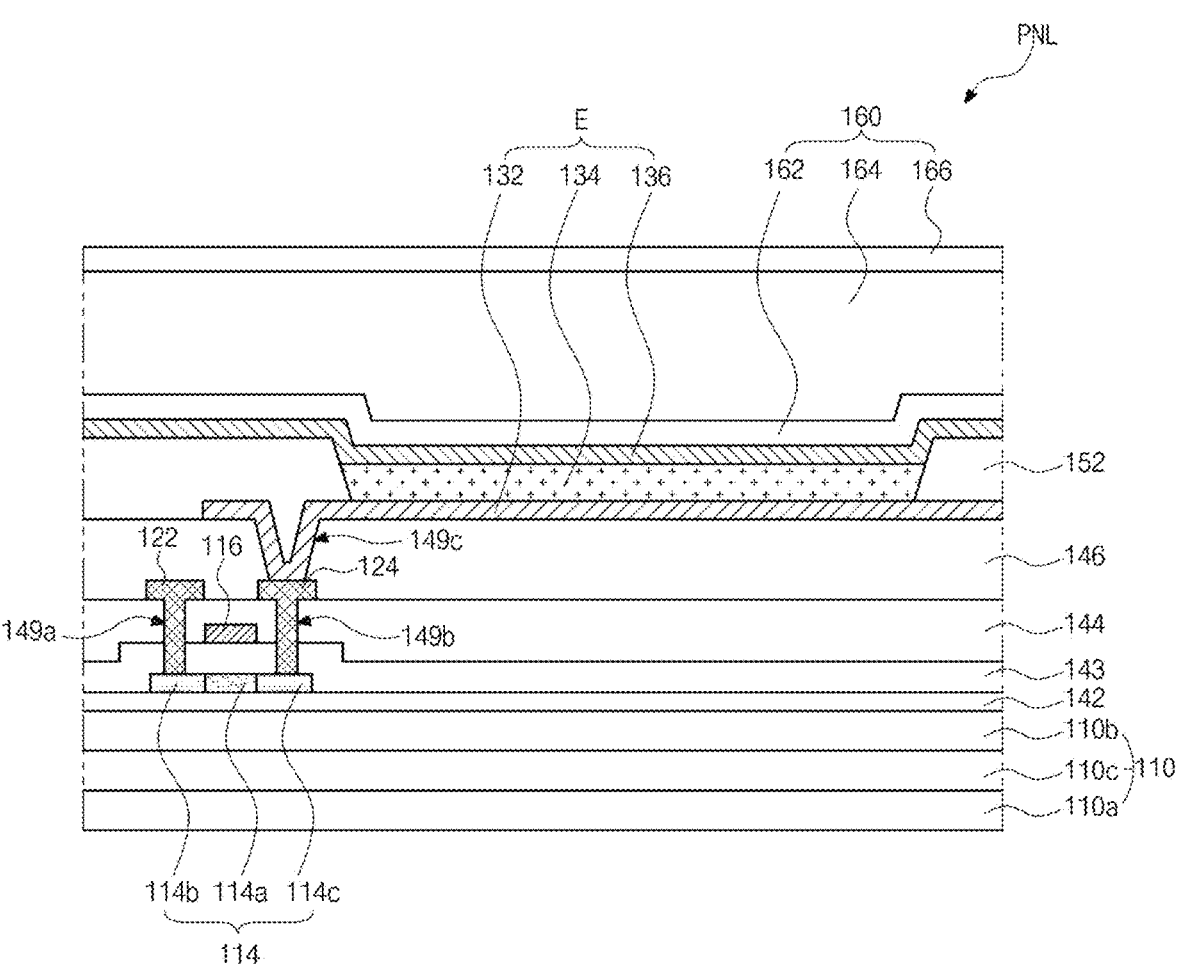
FIG. 4 is a cross-sectional view illustrating a display panel according to an embodiment of the present disclosure.

FIG. 4 is a cross-sectional view illustrating a display panel according to an embodiment of the present disclosure. Although the display panel PNL includes a plurality of sub-pixels, one sub-pixel is illustrated in FIG. 4 for convenience of explanations.

As shown in FIG. 4, a thin film transistor T can be disposed on a substrate 110. Although various thin film transistors such as a switching thin film transistor, a driving thin film transistor, a sensing thin film transistor, and an auxiliary thin film transistor can be disposed in each sub-pixel of the display panel PNL, one thin film transistor T is shown in FIG. 4 for convenience of explanations. Accordingly, the thin film transistor T can be any one of the switching thin film transistor, the driving thin film transistor, the sensing thin film transistor, and the auxiliary thin film transistor.

Since the switching thin film transistor, the driving thin film transistor, the sensing thin film transistor, and the auxiliary thin film transistor can all have the same or substantially same structure, a structure of all the thin film transistors can be expressed with the thin film transistor T.

As shown in FIG. 4, the thin film transistor T can include a semiconductor layer 114 formed on a buffer layer 142 which is formed on the substrate 110, and a gate insulating layer 143 stacked on the buffer layer 142 to cover the semiconductor layer 114, a gate electrode 116 disposed on the gate insulating layer 143, an inter-layered insulating layer 144 stacked on the gate insulating layer 143 to cover the gate electrode 116, and source electrode 122 and the drain electrode 124 disposed on the inter-layered insulating layer 144. Other layers or structures can be provided in the display panel PNL.

The substrate 110 can include a first base film 110a, a second base film 110b, and an inorganic inter-layered insulating layer 110c disposed between the first base film 110a and the second base film 110b. The first base film 110a and the second base film 110b can be made of a foldable transparent plastic material. For example, the first base film 110a and the second base film 110b can use PI (polyimide), PET (polyethylene terephthalate), PEN (polyethylene naphthalate), PC (polycarbonate), PES (polyethersulfone), PAR (polyarylate), polysulfone (PSF), or cyclic-olefin copolymer (COC). However, the substrate 110 of the present disclosure is not limited to such the plastic material, but can be made of a foldable thin glass, other materials, or a combination of various materials.

In addition, the inorganic inter-layered insulating layer 110c can be made of an inorganic material such as silicon oxide (SiOx) or silicon nitride (SiNx), but is not limited thereto.

The buffer layer 142 can protect the thin film transistor T formed in a subsequent process from impurities such as alkali ions leaking from the substrate 110 or block moisture that can penetrate from an outside. The buffer layer 142 can be formed of a single layer of silicon oxide (SiOx) or silicon nitride (SiNx) or multi layers including silicon oxide (SiOx) and silicon nitride (SiNx).

The semiconductor layer 114 can be formed of an amorphous semiconductor such as amorphous silicon (a-Si), a crystalline semiconductor such as polycrystalline silicon (p-Si), or an oxide semiconductor such as indium gallium zinc oxide (IGZO), but is not limited thereto. The semiconductor layer 114 can include a channel region 114a at a central region thereof, and a source region 114b and a drain region 114c which are doped regions at both sides of a channel region 114a of the semiconductor layer 114.

The gate electrode 116 can be formed of a single layer or a plurality of layers using a metal(s) such as Cr, Mo, Ta, Cu, Ti, Al, and/or an Al alloy, but is not limited thereto.

The inter-layered insulating layer 144 can be formed of a single layer or a plurality of layers using an organic material such as photoacrylic or an inorganic material such as SiNx or SiOx, but is not limited thereto. In addition, the inter-layered insulating layer 144 can be formed of a plurality of layers of the organic material layer and the inorganic material layer.

The source electrode 122 and the drain electrode 124 can be formed of a single layer or a plurality of layers using a metal(s) such as Cr, Mo, Ta, Cu, Ti, Al, and/or an Al alloy, but is not limited thereto.

The source electrode 122 and the drain electrode 124 can be in ohmic contact with the source region 114b and the drain region 114c of the semiconductor layer 114 through a first contact hole 149a and a second contact hole 149b formed in the gate insulating layer 143 and the inter-layered insulating layer 144, respectively.

A bottom shield metal layer can be disposed below the semiconductor layer 114 and on the substrate 110. The bottom shield metal layer can reduce or minimize a back channel phenomenon caused by charges trapped in the substrate 110 to prevent afterimages or deterioration of a transistor performance. The bottom shield metal layer can be formed of a single layer or a plurality of layers using titanium (Ti), molybdenum (Mo) and/or an alloy of Ti and Mo, but is not limited thereto.

A passivation layer 146 can be formed on the substrate 110 on which the thin film transistor T is disposed. The passivation layer 146 can be formed of an organic material such as photoacrylic, but is not limited thereto, and can include a plurality of layers including an inorganic layer and an organic layer. A third contact hole 149c can be formed in the passivation layer 146.

An anode 132 electrically connected to the drain electrode 124 of the thin film transistor T through the third contact hole 149c can be formed on the passivation layer 146. The anode 132 can be formed of a single layer or a plurality of layers using a metal(s) such as Ca, Ba, Mg, Al, Ag and/or an alloy thereof, but is not limited thereto. The anode 132 can be connected to the drain electrode 124 of the thin film transistor T.

A bank layer 152 can be formed at a boundary of each sub-pixel on the passivation layer 146. The bank layer 152 can be a type of a separation wall defining each sub-pixel. The bank layer 152 can partition the sub-pixels to prevent light of a specific color, which is output from adjacent sub-pixels, from being mixed and output.

A light emitting layer 134 can be formed on the anode 132 and on a portion of an inclined surface of the bank layer 152. The light emitting layer 134 can be an R light emitting layer which is formed in an R sub-pixel to emit red light, a G light emitting layer which is formed in an G sub-pixel to emit green light, or a B light emitting layer which is formed in a B sub-pixel to emit blue light. Alternatively, the light emitting layer 134 can be a W organic light emitting layer emitting a white light.

The light emitting layer 134 can include not only an emitting material layer, but also an electron injection layer and a hole injection layer for respectively injecting electrons and holes into the emitting material layer, and an electron transport layer and a hole blocking layer for transporting injected electrons to the emitting material layer, and an electron blocking layer and a hole transport layer for transporting injected holes to the emitting material layer, but is not limited thereto.

A cathode 136 can be formed on the organic light emitting layer 134 and over the entire display apparatus. The cathode 136 can be made of a transparent conductive material such as indium tin oxide (ITO) or indium zinc oxide (IZO), or a metal through which visible light is transmitted, but is not limited thereto. The cathode 135 can be formed to be thinner than the anode 132.

The anode 132, the light emitting layer 134, and the cathode 136 can form the light emitting element E to output light having a specific wavelength as a signal is applied.

An encapsulation layer 160 can be formed on the cathode 136. The encapsulation layer 160 can include a first encapsulation layer 162 made of an inorganic material, a second encapsulation layer 164 made of an organic material, and a third encapsulation layer 166 made of an inorganic material. For example, the inorganic material can include, but is not limited to, SiNx and SiOx. In addition, the organic material can include, but is not limited to, polyethylene terephthalate, polyethylene naphthalate, polycarbonate, polyimide, polyethylene sulfonate, polyoxymethylene, polyarylate, or a mixture thereof.

Referring to FIG. 3, the plate PLATE can be disposed on a bottom (or lower) surface of the display panel PNL. The plate PLATE can support the display panel PNL. For example, the plate PLATE can be formed of, but not limited to, a high-strength metal capable of protecting the display panel PNL from external impact, dissipating internal heat and dissipating internal static electricity. The plate PLATE can be formed of at least one of copper (Cu), copper (Cu) foam, stainless steel, graphite, and polyethylene terephthalate (PET), an alloy material thereof, and/or a combination structure thereof, but is not limited thereto.

The polarizing plate POL can be disposed on the display panel PNL. The polarizing plate POL can prevent reflection of light input from an outside to improve visibility of the display apparatus DIS. The polarizing plate POL can transmit only light in a specific polarization direction among an external light incident from the outside and absorb a remaining light, and the light transmitted through the polarizing plate POL can be reflected by the display panel PNL and then can be incident on the polarizing plate POL again. At this time, since the polarization direction of the reflected external light is changed, the light incident back to the polarizing plate POL can be absorbed by the polarizing plate POL and may not be output to the outside, so that a reflection of the external light can be prevented.

The polarizing plate POL can be a circular polarizing plate. As such, when a circular polarizing plate is used, a retardation film of $\lambda/4$ can be further provided between the polarizing plate POL and the display panel PNL.

The polarizing plate POL can be formed of a polymer film mainly composed of a polyvinyl alcohol (PVA)-based resin including iodine or dichroic dye, and protective films on both surfaces thereof. In this case, the iodine or the dichroic dye is uniaxially stretched to be aligned in one direction. Alternatively, the polarizing plate POL can use a material other than the PVA-based resin. For example, the polarizing plate POL can use an O-type polarizer in which a liquid crystal composition including a dichroic material and a liquid crystal compound is oriented in a predetermined direction, and/or an E-type polarizing material in which a lyotropic liquid crystal is aligned in a predetermined direction.

The protective film of the polarizing plate POL can be formed of a transparent film without phase retardation, and can protect the polymer film from external moisture or contamination. The protective film can use triacetyl cellulose (TAC), polyethylene terephthalate (PET), cycloolefin polymer (COP), or a combination thereof, but is not limited thereto.

The transparent film TF can be disposed on a top (or upper) surface of the polarizing plate POL. A black matrix BM can be formed on an edge of the transparent film TF to prevent light output from the display panel PNL from leaking to an edge of the display apparatus DIS. The black matrix BM can be formed of a metal oxide such as CrOx, a black resin, or black ink, but is not limited thereto.

The transparent film TF can be formed of a transparent film such as polyethylene terephthalate, but is not limited thereto. For example, the transparent film TF can use triacetyl cellulose, cyclo-olefin polymer (COP), or a combination thereof.

The front glass TCG can be disposed on a top surface of the transparent film TF. The front glass TCG can transmit an image of the display panel PNL to the outside as it is, and protect the display panel PNL from external impact and external environment or stress. The front glass TCG can be formed to have a thickness of several tens of micrometers, so that the front glass TCG can be damaged by a small external impact or continuous folding.

The protective member BF can be disposed on a top surface of the front glass TCG, and can protect the front glass TCG from compressive stress and elongational stress caused by external impact or continuous folding. In addition, when the front glass TCG is damaged by an external impact or stress to generate glass powder, the protective member BF can prevent the glass powder from scattering to the outside.

The protective member BF can include a protective film and a hard coating layer. The protective film can be formed of a transparent film such as polyethylene terephthalate, but is not limited thereto. For example, the protective film can use triacetyl cellulose, cycloolefin polymer, or a combination thereof.

The hard coating layer can be formed on the protective film to protect the display apparatus DIS from scratches. The hard coating layer can be formed by a laminating organic material(s) such as urethane acrylic resin, methacrylic resin, and/or silsesquioxane compound, but is not limited thereto.

In addition, the protective member BF can include a functional layer. The functional layer can be formed by being laminated on the hard coating layer or surface treatment of the hard coating layer. The functional layer can include at least one of an anti-fingerprint layer, an anti-contamination layer, and an anti-glare layer, but is not limited thereto.

At least one of the first adhesive layer ADR_1 for attaching the display panel PNL and the plate (PLATE), the second adhesive layer ADR_2 for attaching the polarizing plate POL and the display panel PNL, the third adhesive layer ADR_3 for attaching the transparent film TF and the polarizing plate POL, the fourth adhesive layer ADR_4 for attaching the front glass TCG and the transparent film TF, and the fifth adhesive layer ADR_5 for attaching the protective member BF and the front glass TCG can be formed by coating an adhesive material made of OCR (Optical Clear Resin) with low liquid viscosity and then curing (or hardening) it.

The adhesive material can use an acrylic resin, a silicone resin, or a urethane resin. Although described later, the adhesive layers ADR_1 to ADR_5 according to the present disclosure can maintain a low modulus compared to the conventional OCR, and can be easily peeled off when the components of the display apparatus DIS are cut and removed, and no residue of the adhesive layers ADR_1 to ADR_5 remains in a region from which the adhesive material is removed.

The hole TH can be formed in the optical component area OSU of the display apparatus DIS, and a plurality of openings FH can be formed in the folding area FDU (or the bending area).

The optical components such as a camera, a proximity sensor, an infrared (IR) sensor, an ultraviolet (UV) sensor, and a fingerprint recognition sensor can be disposed inside the hole TH, but is not limited thereto.

The openings FH can be formed in a plurality of slit shapes, from one side to the other side of the display apparatus DIS, along a vertical direction to the folding or bending direction. Thus, compressive stress and elongational stress are reduced in the folding area FDU, so that the display apparatus DIS is smoothly folded or bent.

The hole TH can be formed in the plate PLATE, the display panel PNL, the polarizing plate POL and the transparent film TF. In addition, the hole TH can be formed in the first to fourth adhesive layers ADR_1 to ADR_4. The plurality of openings FH can be formed in the plate PLATE and the first adhesive layer ADR_1. The hole TH need not be formed to penetrate through all of plate PLATE, the display panel PNL, the polarizing plate POL and the transparent film TF and the first to fourth adhesive layers ADR_1 to ADR_4. For example, the hole TH can be formed through only some of the layers such as the plate PLATE and the display panel PNL, and can optionally not be formed in the polarizing plate POL and beyond. In similar light, the hole TH can be formed in the first and second adhesive layers ADR_1 and ADR_2, and not in the others adhesive layers such as ADR_3 to ADR_5. Accordingly, the hole TH can penetrate through one or more of the plate PLATE, the display panel PNL, the polarizing plate POL and the transparent film TF, and one or more of the first to fourth adhesive layers ADR_1 to ADR_4.

The hole TH can be formed by a plurality of processes rather than a single process. For example, the hole TH can be formed by a process of processing the plate PLATE and the first adhesive layer ADR_1 with a laser, a process of processing the display panel PNL and the second adhesive layer ADR_2 with a laser, and a process of processing the polarizing plate POL and the third adhesive layer ADR_3 with a laser. In addition, the processing of the display panel PNL can be performed by different processes depending on locations.

The reason why the hole TH is formed by a plurality of processes rather than a single process is because materials of the components to be processed are different. Since the materials of the plate PLATE, the substrate of the display panel PNL, the metal pattern of the display panel PNL and the polarizing plate POL are different, melting temperatures for laser irradiation are different. Therefore, the hole TH may not be formed by a single processing by a single laser, but can be formed by a plurality of processes with different types of lasers or lasers of different wavelengths.

The openings FH can be formed by the process of processing the plate PLATE of the hole TH.

When the hole TH and the plurality of openings FH are processed, the adhesive layers ADR_1 to ADR_4 are also processed and removed. For example, in the present disclosure, the adhesive layer ADR_1 to ADR_5 are formed by coating and curing a liquid adhesive material having a low viscosity. Thus, it is easy to peel off the cut material and remove the adhesive material during laser processing, so that no residue of the adhesive material remains after the processing. Further, an adhesive force is maintained after completion of the display apparatus DIS, so that defects due to peeling of components can be prevented and the display apparatus DIS can be smoothly folded, bent or rolled.

The adhesive layers ADR_1 to ADR_5 according to the present disclosure can be configured by including additives such as oligomer, photoinitiator, and/or nano-silica particle in an acryl-based, silicone-based, or urethane-based monomer. The monomer could be any other adhesive resin monomer as can be conceived by a person skilled in the art.

For example, in the present disclosure, a content of the monomer is increased and a content of the oligomer is decreased. For example, in the case of the conventional OCR, based on 100 wt % of each of the adhesive layers ADR_1 to ADR_5, a content of the monomer is about 25 wt % and a content of the oligomer is about 60 wt %. However, in the adhesive material according to the present disclosure, based on 100 wt % of each of the adhesive layers ADR_1 to ADR_5, a content or an amount of the monomer can be greater than an amount of the oligomer in at least one of the adhesive layers ADR_1 to ADR_5. In one or more examples, an amount in wt % of the monomer can be greater than three times the amount in wt % of the oligomer in the at least one adhesive layer ADR_1 to ADR_5. In one specific example, a content of the monomer can be increased to about 70 wt % or more and a content of the oligomer can be decreased to about 20 wt % or less, for example.

Figure 5:
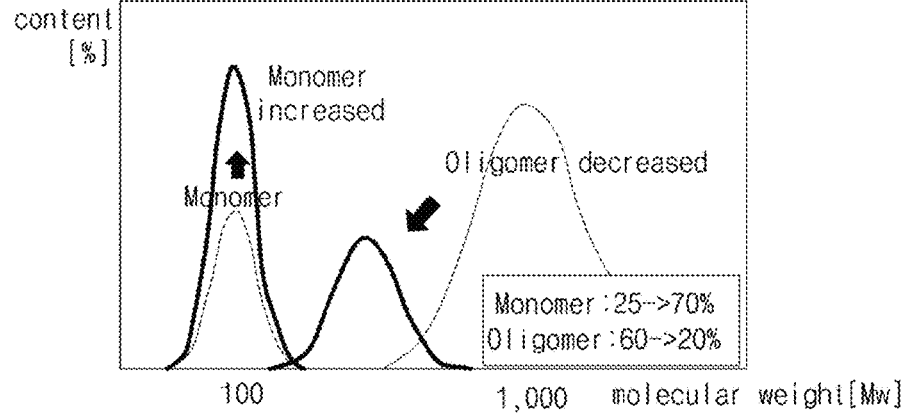
FIG. 5 is a graph illustrating a relationship between contents of monomer and oligomer and molecular weights according to an embodiment of the present disclosure.

FIG. 5 is a graph illustrating a relationship between contents of monomer and oligomer and molecular weights according to an embodiment of the present disclosure. As shown in FIG. 5, when a content of the monomer is increased and a content of the oligomer is decreased, a molecular weight is decreased. Accordingly, a molecular weight of the adhesive material forming the adhesive layers ADR_1 to ADR_5 according to the present disclosure is reduced compared to the conventional OCR.

Figure 6:
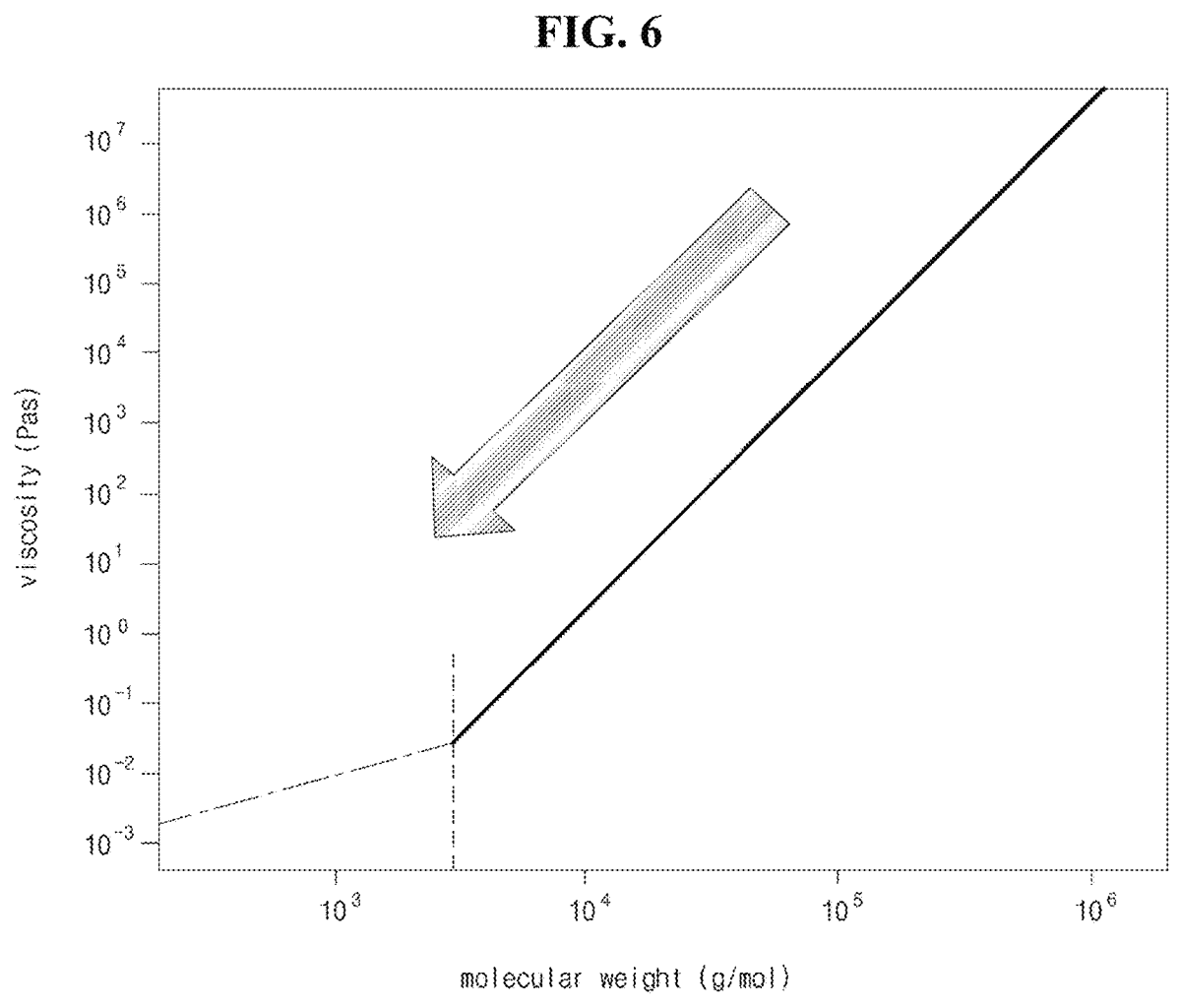

FIG. 6 is a graph illustrating a relationship between molecular weight and viscosity according to an embodiment of the present disclosure. As shown in FIG. 6, as the molecular weight is decreased, the viscosity is decreased rapidly. Therefore, the viscosity of the adhesive material according to the present disclosure is significantly reduced compared to that of the conventional OCR.

The viscosity of the conventional OCR is about 5,000 cps, whereas the viscosity of the adhesive material according to the present disclosure is decreased to about 25 cps or less as the molecular weight is decreased. However, the viscosity of the adhesive material need not be about 25 cps or less. For example, the viscosity of the adhesive material can be less than 5,000 cps, such as about 2,500 cps or less, such as 100 cps or less.

As the viscosity is decreased, the adhesive force of the adhesive material is decreased, and the decrease in adhesive force causes an increase in modulus, which can cause a limitation in folding or bending of the display apparatus DIS.

However, in the present disclosure, by including the nano-silica particle as an additive, the modulus increase can be prevented and the modulus can be kept constant. The nano-silica particle is an example of an inorganic particle and can serve as a reinforcing material. When the polymer is cured, a length between molecules thereof decreases and is accompanied by shrinkage, thereby increasing a modulus. The nano-silica particle makes dispersion inside the polymer uniform and reinforces physical properties. In addition, the nano-silica particle is greater that a curing length between molecules, for example, crosslinking density. Therefore, since the nano-silica particle serve as a bumper to prevent the curing length between molecules from being shrunk to be less than the cross-linking density, so that an increase in modulus of the adhesive material is prevented.

Therefore, in the present disclosure, since the adhesive including the additive is used, the processed (e.g., cut) portion can be easily peeled off when the hole TH or the opening FH is formed, and it is possible to prevent the adhesive layers ADR_1 to ADR_5 in the processed region from remaining as a residue, and also, it is possible to prevent a defect in folding or bending due to an increase in modulus.

In addition, in the present disclosure, since the viscosity of the adhesive material is reduced, the adhesive material can be coated by an inkjet method when forming the adhesive layers ADR_1 to ADR_5. Accordingly, the thickness of the adhesive layers ADR_1 to ADR_5 can be easily controlled and the adhesive layers ADR_1 to ADR_5 having a relatively thin thickness can be formed.

Further, in the present disclosure, since the adhesive layers ADR_1 to ADR_5 are formed by the inkjet method, there is no need to punch the adhesive during the manufacturing process of the display apparatus DIS. Other forming methods, such as spraying, injection, or printing methods can be used.

In the case of bonding the display panel PNL, the polarizing plate POL and the front glass TCG using a double-sided tape type OCA, one surface of the tape type OCA is attached to an object to be bonded and the other surface of the tape type OCA is attached to the other object to be bonded, so that the objects are bonded to each other. Since this OCA is manufactured with a set shape and a set size and then is used for a process of the display apparatus DIS, the OCA needs to be punched out after the bonding to make the shape and size of the OCA the same as or similar to the shape and size of the bonded objects. In addition, in the subsequent process, such the OCA needs to be continuously punched out according to bonded objects.

On the other hand, in the present disclosure, since the adhesive layers ADR_1 to ADR_5 are formed by coating an adhesive material to a surface of an object to be bonded by the inkjet method, the adhesive layers ADR to 1 to ADR_5 can have shape and size corresponding to the bonded objects can be formed. Accordingly, in the present disclosure, since the punching process of the adhesive layers ADR_1 to ADR_5 is not required, the manufacturing process can be simplified and the manufacturing cost can be reduced.

In the display apparatus DIS according to the embodiment of the present disclosure, a each of all adhesive layers ADR_1 to ADR_5 includes a content of a monomer and an oligomers which are about 70 wt % or more and 20 wt % or less, respectively, based on 100 wt % of each of the adhesive layer ADR_1 to ADR_5, and uses an adhesive material including an additive of a nano-silica particle, but all adhesive layers ADR_1 to ADR_5 of the display apparatus DIS of the embodiment of the present disclosure are not limited to this configuration.

For example, in the display apparatus DIS according to the embodiment of the present disclosure, some components can be bonded using the adhesive layer according to the present disclosure, and other some components can be bonded using an OCA or OCR. For example, the polarizing plate POL is manufactured and supplied by a separate polarizing plate manufacturer, and in this case, the polarizing plate POL can be delivered with an OCA attached to a bottom surface thereof, but is not limited thereto.

In the display apparatus DIS according to the embodiment of the present disclosure, the hole TH can be formed by processing the plate PLATE, the display panel PNL, the polarizing plate POL and the transparent film TF, but is not limited thereto. The hole TH can be formed by processing only a part of the display panel PNL, not the whole of the display panel PNL. For example, in the case of the display panel PNL having the structure shown in FIG. 4, the entire substrate 110, for example, the first base film 110*a*, the second base film 110*c*, and the inorganic interlayer insulating layer 110*b* can be all processed and cut, or only the first base film 110*a* which is a part of the substrate 110 can be processed and cut.

In addition, all of the various layers of the display panel PNL can be processed and removed, or a transparent layer among the various layers can be processed and only an opaque layer such as a metal pattern can be processed and removed.

In the present disclosure, a content of the monomer of the adhesive layers ADR_1 to ADR_5 bonding the structures of the display apparatus DIS is increased and a content of the oligomer is decreased, thus the molecular weight is decreased, and thus the viscosity can be reduced. Accordingly, the cut portion when processing the hole TH and the opening FH can be easily peeled off, and no adhesive residue remains inside the hole TH and the opening FH after the processing.

In addition, in the present disclosure, since the nano-silica particle is added in the present disclosure, an increase in modulus can be prevented even when a content of the monomer of the adhesive material is increased and a content of the oligomer of the adhesive material is reduced, so that the adhesive force of the adhesive layers ADR_1 to ADR_5 can be maintained, and smooth folding or bending can be conducted.

In the present disclose, in one embodiment, the adhesive material can be applied to the display apparatus. However, the embodiments of the present disclosure are not limited to this. For example, the adhesive material can be applied to other electronic products or mechanical configuration in case that the viscosity of adhesive material need to be reduce while preventing an increase in modulus.

FIGS. 7A to 7H are views illustrating a method of manufacturing a display apparatus according to an embodiment of the present disclosure.

Figure 7A:
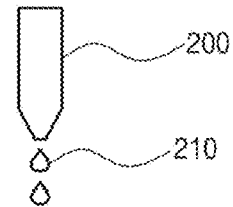
FIGS. 7A to 7H are views illustrating a method of manufacturing a display apparatus according to an embodiment of the present disclosure.

First, as shown in FIG. 7A, a display panel PNL can be formed on a support substrate SUB made of a hard material such as glass or metal. Other materials, such as a plastic or a ceramic can also be used.

The display panel PNL can be formed in the structure shown in FIG. 4.

The substrate 110 of the display panel PNL can be formed by coating and curing a liquid plastic material on the support substrate SUB to form a first base film 110a, then forming an inorganic inter-layered insulating layer 110c such as SiOx or SiNx on the first base film 110a, and then coating and curing a liquid plastic material on the inorganic inter-layered insulating layer 110c to form a second base film 110b.

A thin film transistor and a light emitting element E can be formed on the substrate 110, and an encapsulation layer 160 including a first encapsulation layer 162, a second encapsulation layer 164, and a third encapsulation layer 166 can be formed on the thin film transistor and the light emitting element E.

Next, a syringe 200 filled with an adhesive material 210 can be placed on the display panel PNL, and then a set amount of the adhesive material 210 can be dropped onto a set area of the display panel PNL.

Figure 8:
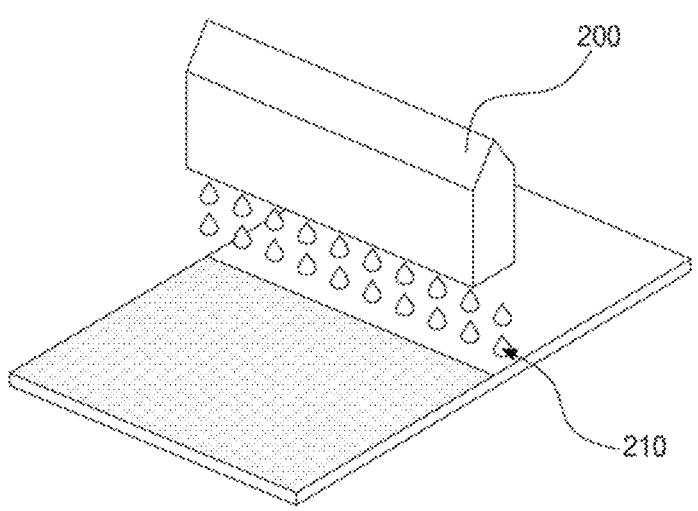
FIG. 8 is a view illustrating coating an adhesive material to a display panel by a syringe according to an embodiment of the present disclosure.

As shown in FIG. 8, the syringe 200 can extend along a short side of the display panel PNL so that a length of the syringe 200 can be the same or substantially same as a length of the short side of the display panel PNL. As the syringe 200 moves or the display panel PNL moves, the adhesive material 210 can be dropped onto the display panel PNL through a nozzle formed on a bottom surface of the syringe 200. Alternatively, the syringe 200 can extend along a long side of the display panel PNL so that a length of the syringe 200 can be the same or substantially same as a length of the long side of the display panel PNL.

In this case, the adhesive material 210 may not be continuously dropped over the entire region of a top surface of the display panel PNL, but can be dropped only on a desired region by controlling opening and closing of the nozzle. Since the adhesive material 210 can have a viscosity of 25 cps or less, the dropped adhesive material 210 can have fluidity. Accordingly, the adhesive material 210 can be uniformly coated to the top surface of the display panel PNL as time elapses or as a bonding pressure is applied.

In the drawings, the syringe 200 is configured to have the same length as the width of the short side of the display panel PNL so that the adhesive material 210 is dropped onto the short side of the display panel PNL at once, but the syringe 200 is not limited to this configuration. For example, a length of the syringe 200 can be made smaller than a width of the short side of the display panel PNL, a plurality of drops can be performed in the short side direction. Alternatively, the syringe 200 can be formed in a cylindrical shape, and the adhesive material can be coated by point-dropping the adhesive material 210 at a plurality of positions set.

Figure 7B:
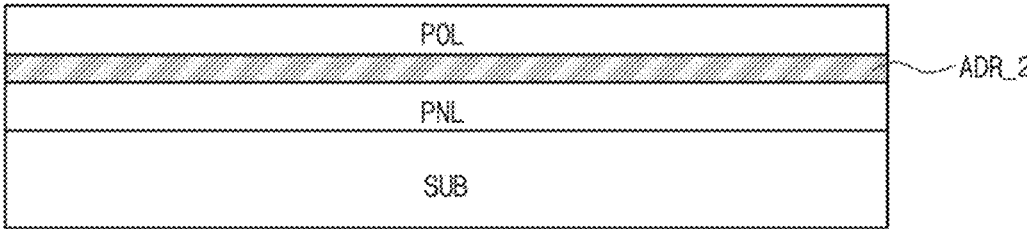

Thereafter, as shown in FIG. 7B, a polarizing plate POL can be placed on the coated adhesive material 210. Then, by irradiating light such as UV rays, a second adhesive layer ADR_2 for bonding the display panel PNL and the polarizing plate POL to each other can be formed.

Figure 7C:
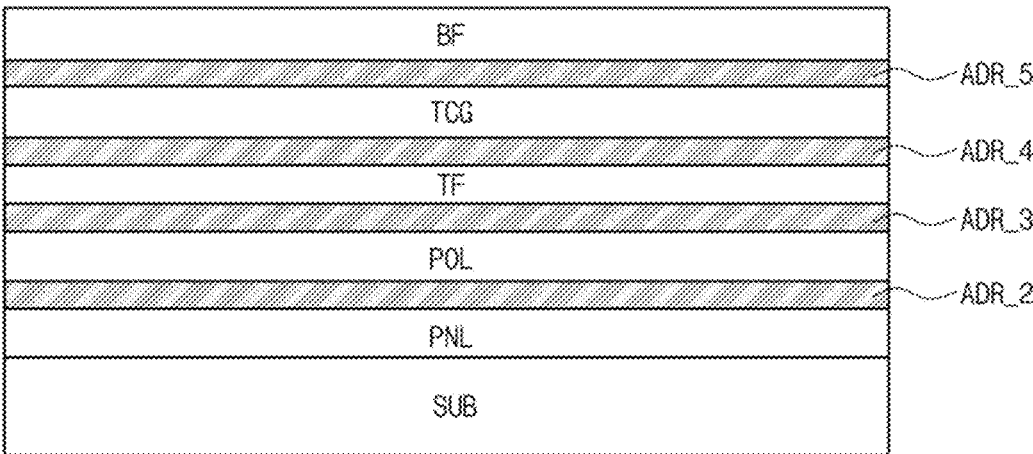

Then, as shown in FIG. 7C, the adhesive material 210 can be coated again by the syringe 200 on the polarizing plate POL. Then, a transparent film TF can be placed on the adhesive material 210 and be irradiated with light to cure the adhesive material 210, so that the transparent film TF can be attached to the polarizing plate POL by a third adhesive layer ADR_3.

Through repeating this process, a front glass TCG can be attached to the transparent film TF by a fourth adhesive layer ADR_4, and then a protective member BF can be attached to the front glass TCG by a fifth adhesive layer ADR_5.

Figure 7D:
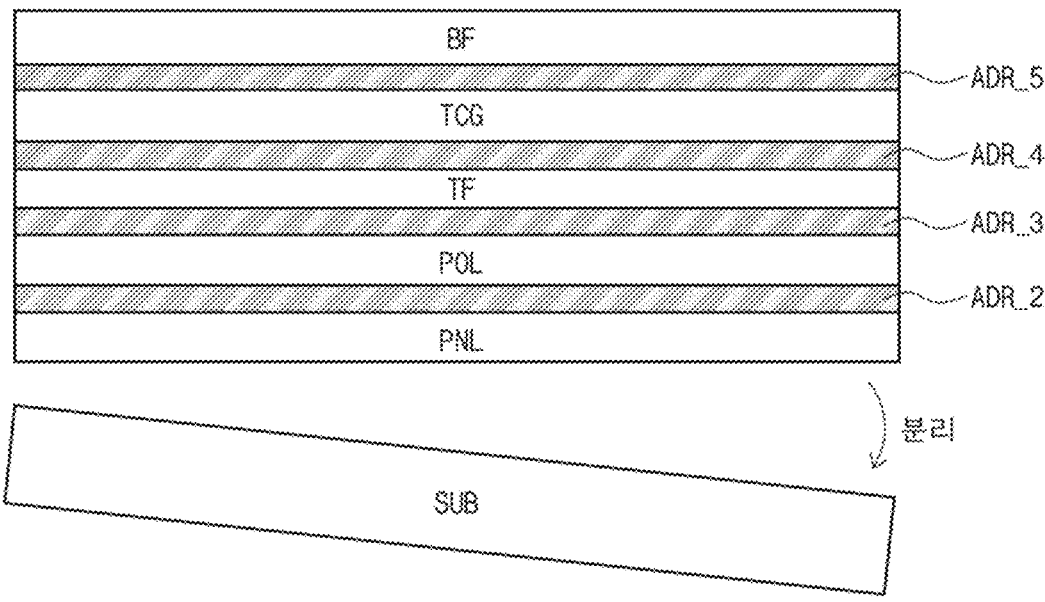

Thereafter, as shown in FIG. 7D, the support substrate SUB can be separated from the display panel PNL. A sacrificial layer can be formed between the display panel PNL and the support substrate SUB, and the sacrificial layer can be removed when light such as UV rays is irradiated or heat is applied, so that the support substrate SUB can be separated from the display panel PNL.

Figure 7E:
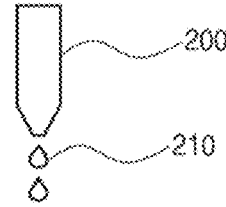
Figure 7E:
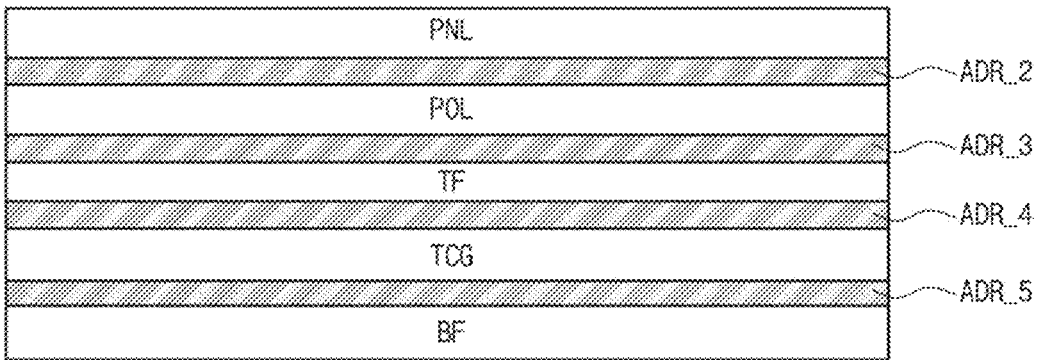

Thereafter, as shown in FIG. 7E, an object can be inverted so that a bottom surface of the display panel PNL faces upward, and then the adhesive material 210 can be coated on the bottom surface of the display panel PNL by the syringe 200.

Figure 7F:
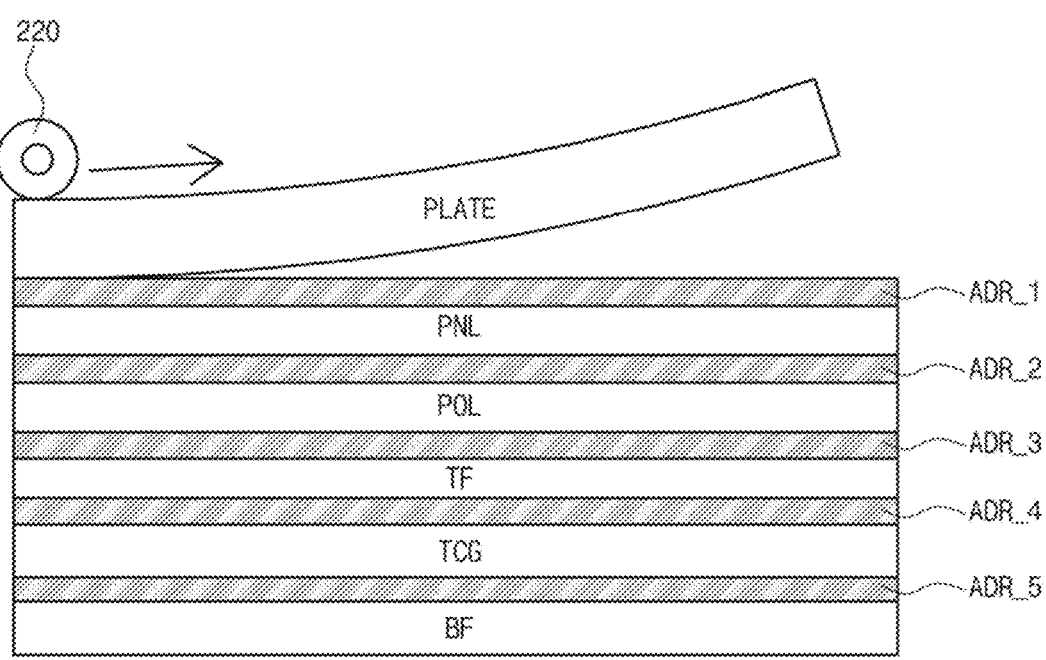

Subsequently, as shown in FIG. 7F, a plate PLATE can be disposed on the adhesive material 210 coated on the bottom surface of the display panel PNL, and then a pressure can be applied by a roller 220 and light such as UV rays can be irradiated. Accordingly, as shown in FIG. 7F, the plate PLATE can be attached to the bottom surface of the display panel PNL.

Figure 7G:
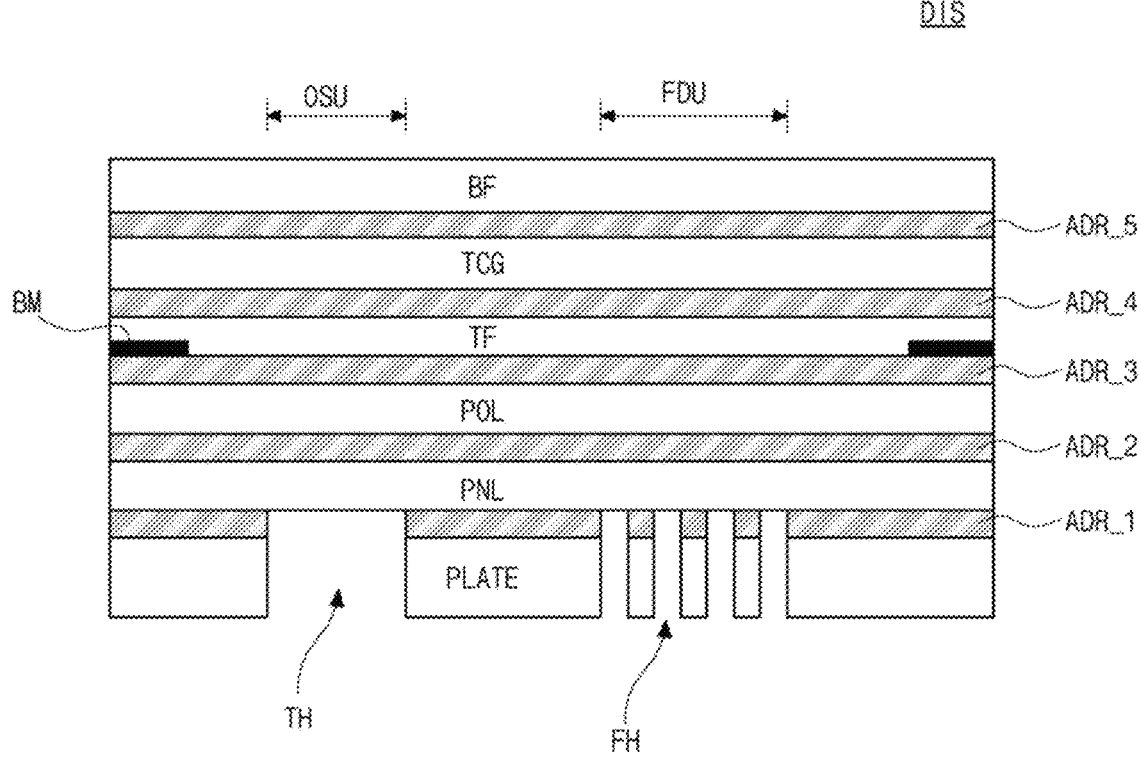

Next, as shown in FIG. 7G, by irradiating a laser to the plate PLATE in an optical component area OSU and a folding area FDU, the plate PLATE and the first adhesive layer ADR_1 can be cut. For another example, the first base film 110a of the substrate 110 of the display panel PNL in the optical component area OSU can be cut by laser irradiation.

Figure 7H:
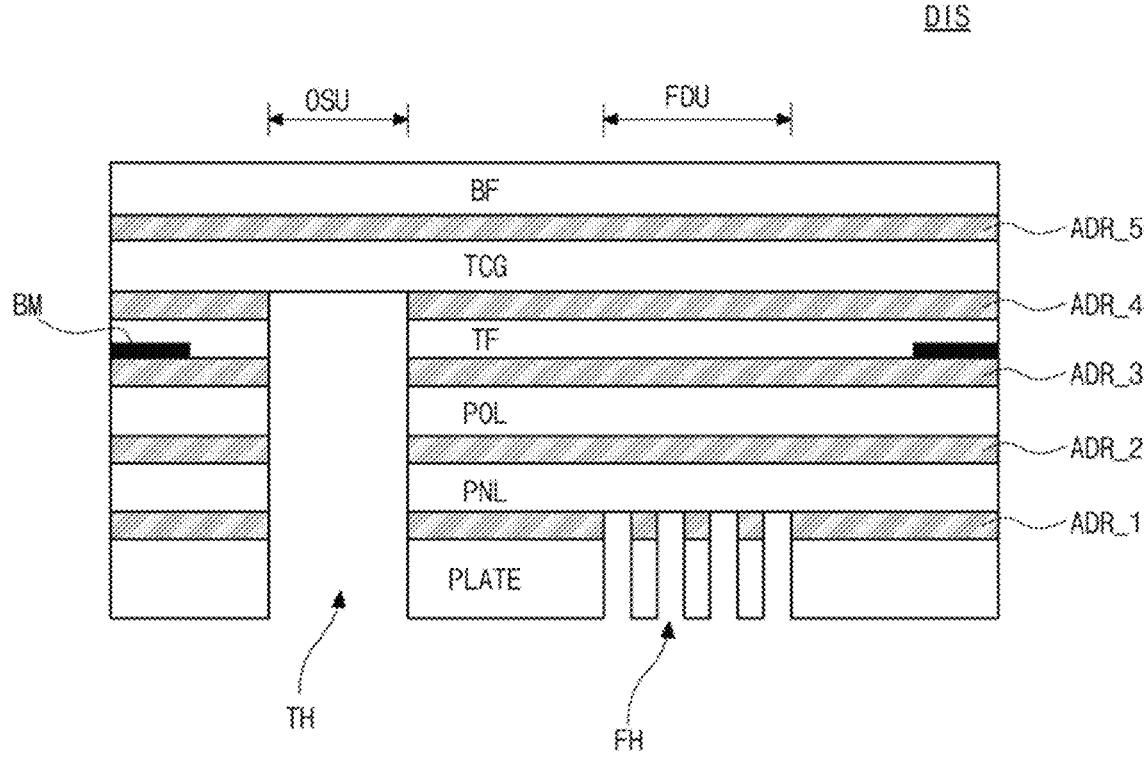

Thereafter, as shown in FIG. 7H, the display panel PNL, the second adhesive layer ADR_2, the polarizing plate POL, the third adhesive layer ADR_3, the transparent film TF and the fourth adhesive layer ADR_4 in the optical component area OSU can be processed and cut, and then the cut portion can be removed to form a hole TH.

In this case, the display panel PNL, the polarizing plate POL, and the transparent film TF in the optical component area OSU can be processed with the same process or can be processed with different processes.

Thereafter, by inserting (or accommodating) the optical component into the hole TH and assembling it, the display apparatus DIS can be completed.

Figure 9:
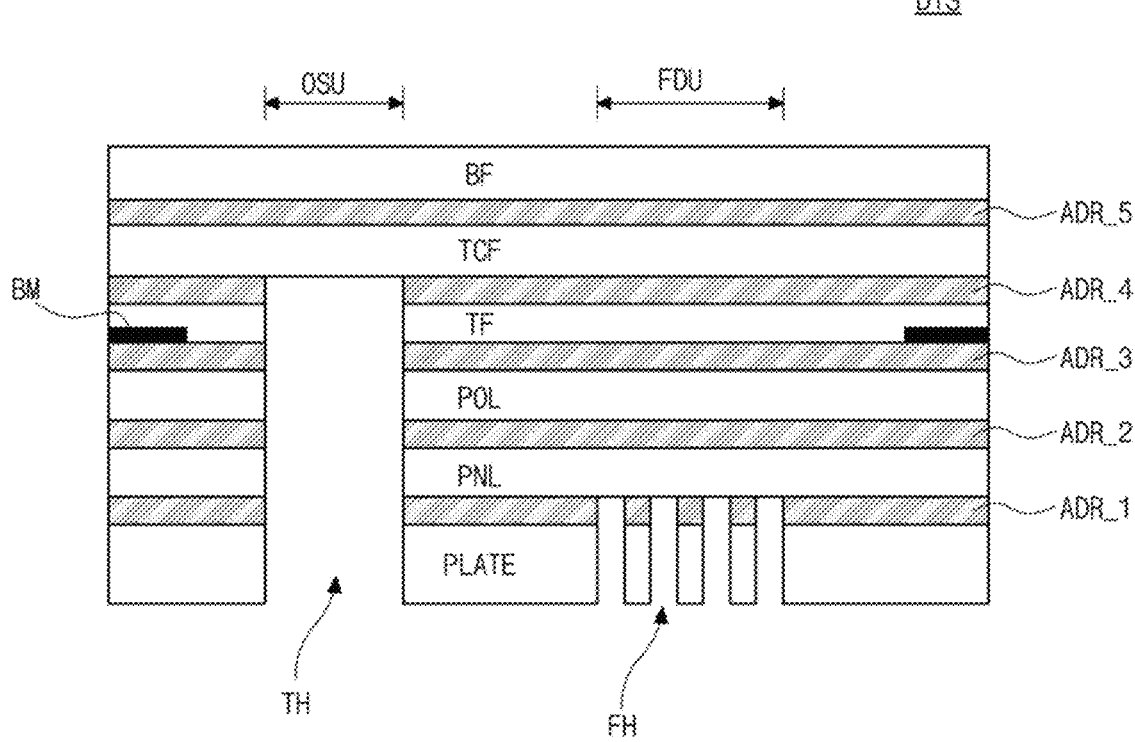
FIG. 9 is a view illustrating a structure of a display apparatus according to another embodiment of the present disclosure.

FIG. 9 is a view illustrating a structure of a display apparatus according to another embodiment of the present disclosure. At this time, Explanations of the same configuration as the embodiment shown in FIG. 3 can be omitted or simplified, and other configuration can be described in detail.

As shown in FIG. 9, the display apparatus DIS according to the embodiment of the present disclosure can include a plate PLATE, a display panel PNL disposed on the plate PLATE to display an actual image, a polarizing plate POL disposed on the a display panel PNL to prevent reflection of external light incident from the outside, a first film TF disposed on the polarizing plate POL, a second film TCF disposed on the first film TF, and a protective member BF disposed on the second film TCF.

The display panel PNL can be attached to the plate PLATE by a first adhesive layer ADR_1, the polarizing plate POL can be attached to the display panel PNL by a second adhesive layer ADR_2, and the first film TF can be attached to the polarizing plate POL by a third adhesive layer ADR_3. In addition, the second film TCF can be attached to the first film TF by a fourth adhesive layer ADR_4, and the protective member BF can be attached to the second film TCF by a fifth adhesive layer ADR_5.

The second film TCF can be formed of CPI (Color Polyimide). The second film TCF can transmit an image of the display panel PNL to the outside as it is, and can protect the display panel PNL from external impact and external environment or stress.

At least one of the first adhesive layer ADR_1 for attaching the display panel PNL to the plate PLATE, the second adhesive layer ADR_2 for attaching the polarizing plate POL to the display panel PNL, the third adhesive layer ADR_3 for attaching the first film TF to the polarizing plate POL, the fourth adhesive layer ADR_4 for attaching the second film TCF to the first film TF, and the fifth adhesive layer ADR_4 for attaching the protective member BF to the second film TCF can be formed by coating an adhesive material made of OCR having a low liquid viscosity and then curing it. The adhesive material can be formed of acrylic, silicone, or urethane-based monomers with additives such as oligomers, photoinitiators, and nano-silica particles. Based on 100 wt % of each of the adhesive layers ADR_1 to ADR_5, a content of the monomer can be about 70 wt % or more and a content of the oligomer can be about 20 wt % or less. Due to these contents, the molecular weight can be reduced and a viscosity of the adhesive material can be about 25 cps or less, the adhesive material can be coated by an inkjet method.

In addition, the adhesive material can include the nano-silica particle as an additive, and the nano-silica particle can prevent an increase in modulus and keep the modulus constant, so that the display apparatus DIS can be smoothly folded or bent.

A hole TH can be formed in an optical component area OSU of the display apparatus DIS, and a plurality of openings FH can be formed in a folding area FDU (or a bending area). Optical components such as a camera, a proximity sensor, an infrared (IR) sensor, an ultraviolet (UV) sensor, and a fingerprint recognition sensor can be disposed inside the hole TH, but is not limited thereto.

The opening FH can be formed in a slit shape, from one side to the other side of the display apparatus DIS along a vertical direction to the folding or bending direction. Thus, compressive stress and elongational stress are reduced in the folding area FDU, so that the display apparatus DIS is smoothly fold or bend.

The hole TH can be formed in at least one of the plate PLATE, the display panel PNL, the polarizing plate POL and the first film TF. The hole TH can be formed in all of the plate PLATE, the display panel PNL, the polarizing plate POL and the first film TF. In addition, the hole TH can be formed in the first to fourth adhesive layers ADR_1 to ADR_4. The plurality of openings FH can be formed in the plate PLATE and the first adhesive layer ADR_1.

The hole TH and the opening FH can be formed by processing and cutting the display apparatus DIS with a laser. For example, the hole TH can be formed by cutting the plate PLATE, the display panel PNL, the polarizing plate POL and the first film TF with a laser, and the plurality of openings FH can be formed by cutting the plate PLATE and the first adhesive layer ADR_1 with a laser.

Even in the display apparatus DIS of the embodiment of the present disclosure, the viscosity of the adhesive layers ADR_1 to ADR_5 is greatly reduced, the laser-cut portions can be smoothly separated from the display apparatus DIS, and also, it is possible to prevent a residue of the adhesive material from remaining in the cut region of the display apparatus DIS.

The display apparatus according to the embodiments of the present disclosure can be described as follows.

The display apparatus according to the embodiments of the present disclosure includes a plurality of members laminated on each other with an adhesive layer disposed respectively therebetween, wherein at least one of the adhesive layers includes a monomer, an oligomer, a photoinitiator and a nano-inorganic particle.

According to some embodiments of the present disclosure, the monomer can be 70 wt % or more, the oligomer can be 20 wt % or less.

According to some embodiments of the present disclosure, the nano-inorganic particle is a nano-silica particle.

According to some embodiments of the present disclosure, the plurality of members can include a plate, a display panel disposed on the plate to display an image, a polarizing plate disposed on the display panel, a first film disposed on the polarizing plate, a front member disposed on the first film, wherein the adhesive layers include a first adhesive layer disposed between the plate and the display panel, a second adhesive layer disposed between the display panel and the polarizing plate, a third adhesive layer disposed between the polarizing plate and the first film, a fourth adhesive layer disposed between the first film and the front member.

According to some embodiments of the present disclosure, a second adhesive disposed between the polarizing plate and the front member, and a third adhesive disposed between the display panel and the polarizing plate can be further included.

According to some embodiments of the present disclosure, the front member can be formed of glass.

According to some embodiments of the present disclosure, the front member can be formed of a second film.

According to some embodiments of the present disclosure, the front member can be formed of a plastic film.

According to some embodiments of the present disclosure, the plastic film can be formed of at least one of PI (Polyimide), PET (polyethylene terephthalate), PEN (polyethylene naphthalate), PC (polycarbonate), PES (polyethersulfone), PAR (polyarylate), PSF (polysulfone), and COC (cyclic-olefin copolymer).

According to some embodiments of the present disclosure, a black matrix can be disposed on an edge region of the first film.

According to some embodiments of the present disclosure, a protective member can be disposed on the front member, and the protective member can include a protective film, and a coating layer disposed on a top surface of the protective film.

According to some embodiments of the present disclosure, the protective member can further include a functional layer disposed at the coating layer.

According to some embodiments of the present disclosure, the protective member can further include a functional layer, and the functional layer can include at least one of an anti-fingerprint layer, an anti-contamination layer, and an anti-glare layer.

According to some embodiments of the present disclosure, a hole in which an optical component is disposed can be disposed in an optical component area in the display apparatus.

According to some embodiments of the present disclosure, at least one opening can be disposed in a folding area in the display apparatus.

According to some embodiments of the present disclosure, at least one opening can be in a plurality of slit shapes along a vertical direction to the folding direction.

According to some embodiments of the present disclosure, the hole can be formed in at least one of the plate, the display panel, the polarizing plate and the first film.

According to some embodiments of the present disclosure, the at least one opening can be formed in the plate.

According to some embodiments of the present disclosure, an adhesive material to form at least one of the adhesive layers can have a viscosity of 25 cps or less.

An adhesive material according to the embodiments of the present disclosure can include 70 wt % or more of a monomer; 20 wt % or less of an oligomer; a photoinitiator; and/or a nano-inorganic particle.

According to some embodiments of the present disclosure, the adhesive material can have a viscosity of 25 cps or less.

According to some embodiments of the present disclosure, the adhesive material can be applied to an adhesive layer in a display apparatus.

According to some embodiments of the present disclosure, the nano-inorganic particle is a nano-silica particle.

According to some embodiments of the present disclosure, a display apparatus can include a plurality of layers; and at least one adhesive layer disposed between an adjacent two of the plurality of layers, wherein the at least one adhesive layer includes a monomer, an oligomer, a photoinitiator and a nano-inorganic particle, and wherein an amount in wt % of the monomer is greater than an amount in wt % of the oligomer in the at least one adhesive layer.

It will be apparent to those skilled in the art that various modifications and variation can be made in the present disclosure without departing from the technical idea or scope of the disclosure. Thus, it is intended that the present disclosure cover the modifications and variations of this disclosure provided they come within the scope of the appended claims and their equivalents.

What is claimed is:
1. A display apparatus which is foldable, comprising:
a plate;
a display panel on the plate to display an image;
a polarizing plate on the display panel;
a first film on the polarizing plate;
a front member on the first film;
at least one adhesive layer;
a hole in an optical component area in the display apparatus, and an optical component in the hole; and

at least one opening in a folding area, which is spaced apart from the optical component area, in the display apparatus,
wherein at least one adhesive layer includes at least one of a first adhesive layer between the plate and the display panel, a second adhesive layer between the display panel and the polarizing plate, a third adhesive layer between the polarizing plate and the first film, and a fourth adhesive layer between the first film and the front member,
wherein the at least one adhesive layer includes a monomer, an oligomer, a photoinitiator and a nano-inorganic particle, and
wherein an amount of the monomer is 70 wt % or more, and an amount of the oligomer is 20 wt % or less in the at least one adhesive layer.

2. The display apparatus of claim 1, wherein the front member includes glass.

3. The display apparatus of claim 1, wherein the front member includes a second film.

4. The display apparatus of claim 1, wherein the front member includes a plastic film.

5. The display apparatus of claim 1, further comprising a black matrix on an edge region of the first film.

6. The display apparatus of claim 1, further comprising a protective member on the front member, wherein protective member includes:
a protective film; and
a coating layer on a top surface of the protective film.

7. The display apparatus of claim 6, wherein the protective member further includes a functional layer at the coating layer.

8. The display apparatus of claim 6, wherein the protective member further includes a functional layer, and the functional layer includes at least one of an anti-fingerprint layer, an anti-contamination layer, and an anti-glare layer.

9. The display apparatus of claim 1,
wherein the at least one opening is in a plurality of slit shapes along a vertical direction to a folding direction of the display apparatus.

10. The display apparatus of claim 9, wherein the hole is formed in at least one of the plate, the display panel, the polarizing plate and the first film.

11. The display apparatus of claim 9, wherein the at least one opening is in the plate.

12. The display apparatus of claim 1, wherein an adhesive material to form the at least one of the adhesive layers has a viscosity of 25 cps or less.

13. The display apparatus of claim 1, wherein the nano-inorganic particle is a nano-silica particle.

14. The display apparatus of claim 10, wherein the hole penetrates through the plate, the display panel, the polarizing plate, the first film, and the first to fourth adhesive layers, and
wherein the at least one opening penetrates through the plate and the first adhesive layer.

15. The display apparatus of claim 14, wherein the display panel has no opening in the folding area.

* * * * *